United States Patent
Kubo et al.

(10) Patent No.: US 6,758,712 B2
(45) Date of Patent: Jul. 6, 2004

(54) METHODS OF MANUFACTURING WIRING SUBSTRATE AND ELECTRON SOURCE SUBSTRATE AND IMAGE FORMING APPARATUS WITH THE SAME

(75) Inventors: Shinsaku Kubo, Kanagawa (JP); Kazuya Ishiwata, Kanagawa (JP); Yoshimi Uda, Kanagawa (JP); Yasuyuki Watanabe, Tokyo (JP); Hiroaki Toshima, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 189 days.

(21) Appl. No.: 10/011,405

(22) Filed: Dec. 11, 2001

(65) Prior Publication Data

US 2002/0095785 A1 Jul. 25, 2002

(30) Foreign Application Priority Data

Dec. 18, 2000 (JP) ........................................ 2000-383992
Dec. 6, 2001 (JP) ........................................ 2001-372643

(51) Int. Cl.⁷ ................................................ H01J 9/24
(52) U.S. Cl. .......................................................... 445/24
(58) Field of Search ............................................ 445/24

(56) References Cited

U.S. PATENT DOCUMENTS 6,165,034 A * 12/2000 Isono et al. ..................... 445/6
6,213,834 B1 * 4/2001 Ohnishi et al. ................. 445/6
6,604,970 B1   8/2003 Yamada ......................... 445/24

FOREIGN PATENT DOCUMENTS

| JP | 9-283061 | 10/1997 |
| JP | 2000-244122 | 9/2000 |
| JP | 2000-311600 | 11/2000 |

* cited by examiner

Primary Examiner—Kenneth J. Ramsey
(74) Attorney, Agent, or Firm—Fitzpatrick, Cella, Harper & Scinto

(57) ABSTRACT

The wirings on an electron source substrate are formed to intersect with each other in a matrix so as to address the electron emission devices on the substrate. First and second wirings intersect with each other on a crossing point. As such a crossing point, an insulating layer is placed between the first and second wirings. To ensure insulation, a plurality of insulating layers are laminated. According to the present invention, a wiring pattern is provided on the substrate with a conductive paste and baking the wiring pattern of the conductive paste to form the first wiring. Subsequently part of the first wiring is coated at the crossing point with an insulating paste and baking the insulating paste to form a first insulating layer. The coating thickness of the insulating layer formed adjacent to sidewalls of the crossing point is substanially equal to the height of the first wiring.

22 Claims, 9 Drawing Sheets

AFTER BAKING THIRD LAMINATION LAYER

FIG. 1A  FORMING FILM 
(DRYING)
FIG. 1B  EXPOSURE 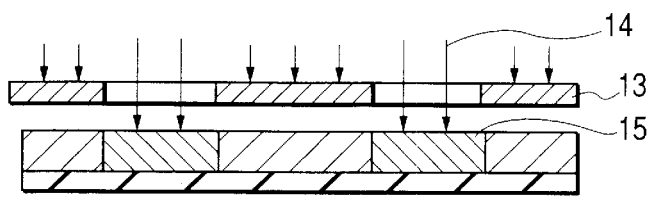
FIG. 1C  DEVELOPING 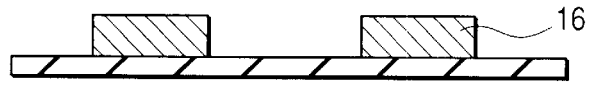
FIG. 1D  BAKING 
FIG. 1E  FORMING FILM 
(DRYING)
FIG. 1F  EXPOSURE 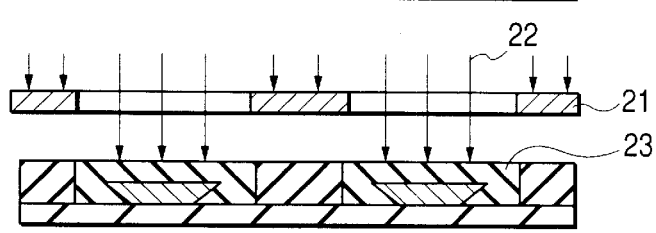
FIG. 1G  DEVELOPING 
FIG. 1H  BAKING 
FIG. 1I  AFTER BAKING SECOND LAMINATION LAYER 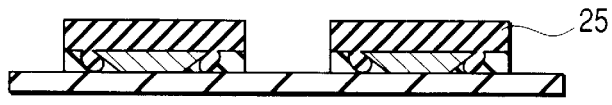
FIG. 1J  AFTER BAKING THIRD LAMINATION LAYER 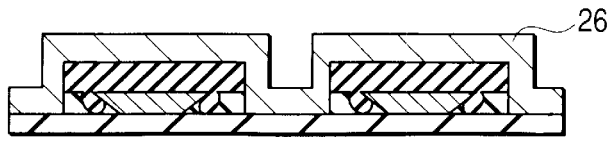

FIG. 2A FORMING FILM
(DRYING)
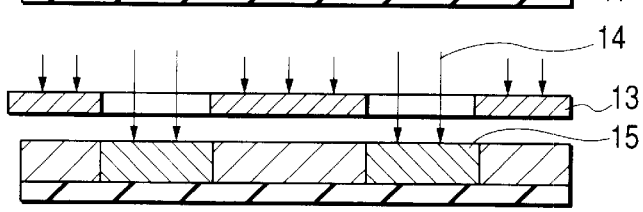
FIG. 2B EXPOSURE
FIG. 2C DEVELOPING
FIG. 2D BAKING
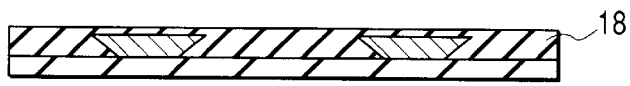
FIG. 2E FORMING FILM
(DRYING)
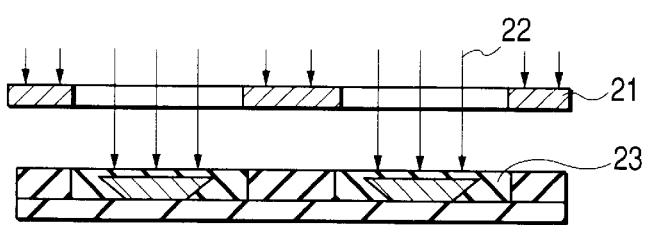
FIG. 2F EXPOSURE
FIG. 2G DEVELOPING
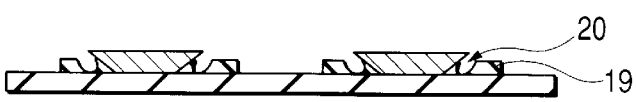
FIG. 2H BAKING
FIG. 2I AFTER BAKING SECOND LAMINATION LAYER
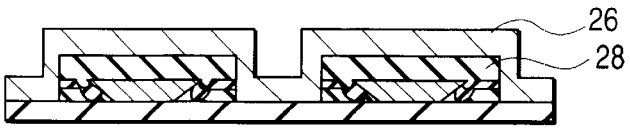
FIG. 2J BAKING THIRD TO FOURTH LAMINATION LAYER FIG. 9A  FORMING FILM (DRYING) 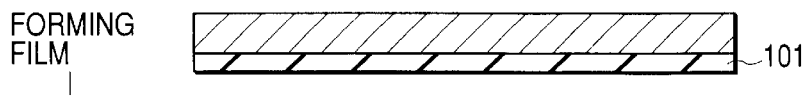
FIG. 9B  EXPOSURE 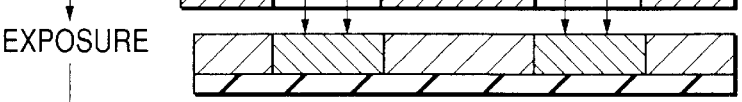
FIG. 9C  DEVELOPING 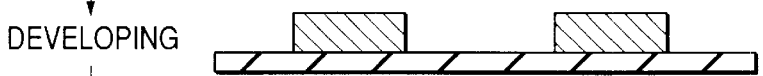
FIG. 9D  BAKING 
FIG. 9E  FORMING FILM (DRYING) 
FIG. 9F  EXPOSURE 
FIG. 9G  DEVELOPING 
FIG. 9H  BAKING 
FIG. 9I  AFTER BAKING SECOND LAMINATION LAYER 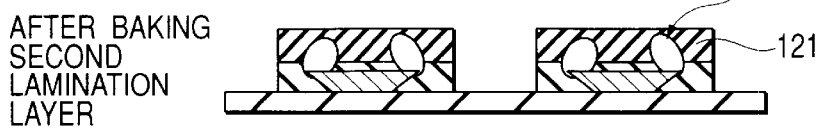
FIG. 9J  AFTER BAKING THIRD LAMINATION LAYER 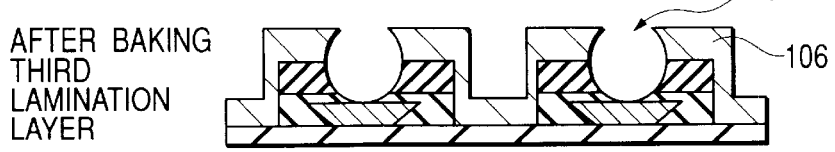

METHODS OF MANUFACTURING WIRING SUBSTRATE AND ELECTRON SOURCE SUBSTRATE AND IMAGE FORMING APPARATUS WITH THE SAME

BACKGROUND OF THE INVENTION

1. Field of the Invention

The present invention relates generally to a method of manufacturing a wiring substrate used suitably for an electron source substrate and an image forming apparatus provided with an electron source substrate. The present invention also relates to a wiring substrate manufactured by the above-mentioned manufacturing method, an electron source substrate with the wiring substrate, and an image forming apparatus with the electron source substrate.

2. Related Background Art

Generally, a so-called "cathode-ray tube (CRT)" has been known widely as an image forming apparatus used for image display on a TV, a personal computer monitor, or the like.

Recently, cathode-ray tubes having a display screen with a size exceeding 30 inches have been introduced. In a cathode-ray tube, however, in order to increase the size of its display screen, it is necessary to increase its depth in accordance with the increase in size of the screen and in turn its weight increases. Hence, such a cathode-ray tube can hardly be said to be suitable for satisfying consumers' wish to watch powerful images on a larger screen since it requires a lager installation space.

Hence, the advent of a low-power-consumption flat image display device that is thin and light has been expected so that such a unit can be hung on a wall instead of a large and heavy cathode-ray tube (CRT).

Liquid crystal displays (LCD) have been researched and developed actively as flat image display devices. However, LCDs are not of a self-emission type. Hence, a light source called a "backlight" is required and most of the power to be consumed is used by this backlight. In addition, there still remains a problem of difficulty in increasing the screen size to over 30 inches.

In place of LCDs with such problems as described above, a self-emission-type thin image forming apparatus has been receiving attention. Examples of such a display unit include a flat image forming apparatus in which fluorescent substances are irradiated with electrons emitted from electron emission devices to be excited and thereby to emit light.

In increasing the size of such an image forming apparatus, it also is suitable from the viewpoint of reduction in cost and resistance to form thick-film wirings by a printing process as wirings for sending a signal to each electron emission device.

However, the following problem is caused when such wirings as described above are formed.

Preferably, the above-mentioned wirings are formed to intersect with each other in a matrix form so as to address the electron emission devices individually. In other words, there are crossing points at which a first wiring and a second wiring intersect (are laminated) with each other. At such a crossing point, an insulating layer (an interlayer insulating layer) for electrically insulating the respective wirings from each other is placed between the first and second wirings. Such a wiring structure is disclosed in, for example, Japanese Patent Application Laid-open Nos. 2000-244122, 2000-311600 and 09-283061.

At the crossing point where the first and second wirings intersect with each other, it is required to secure the electrical insulation between the first and second wirings. In some cases, however, pinholes may be produced in the interlayer insulating layer depending on the manufacturing method or the like. Consequently, a defect of short-circuit between the wirings has been a problem. Furthermore, in order to avoid this, an interlayer insulating layer may be formed of a plurality of layers superimposed on each other. However, this may not be sufficiently effective for avoiding the production of pinholes in some cases.

SUMMARY OF THE INVENTION

The present invention is intended to solve the above-mentioned problem in conventional way. It is an object of the present invention to improve the method of forming a plurality of insulating layers superimposed on each other and thereby to provide a method of manufacturing a wiring substrate that can prevent a defect of short-circuit between wirings that are laminated with each other to be formed, and a wiring substrate that has no defect of short-circuit and is excellent in electrical insulation between wirings.

Another object of the present invention is to provide a method of manufacturing an electron source substrate that can prevent a defect of short-circuit between wirings that are laminated with each other to be formed and to provide an electron source substrate that has no defect of short-circuit and is excellent in electrical insulation between wirings.

Further, still another object of the present invention is to provide an image forming apparatus that has no defect of short-circuit between wirings and that is superior in reliance and to provide a method of manufacturing such an image forming apparatus.

In order to solve the above-mentioned objects, according to the present invention, there is provided a method of manufacturing a wiring substrate on which first and second wirings intersect with each other at a crossing point through an insulating layer, the method being characterized by comprising the steps of:

providing a wiring pattern on the substrate with a conductive paste and baking the wiring pattern of the conductive paste to form the first wiring (or providing a wiring pattern and baking the wiring pattern to form the first wiring the sidewall of which is undercut);

coating part of the first wiring at the crossing point with an insulating paste and baking the insulating paste to form a first insulating layer, the thickness of the insulating layer formed adjacent to sidewalls of the crossing point is substantially equal to the height of the first wiring;

forming a second insulating layer on the first insulating layer coating the crossing point; and forming a second wiring which crosses over the second insulating layer to intersect with the first wiring.

Further, there is provided a method of manufacturing a substrate on which a first and second wirings intersect with each other at a crossing point, comprising the steps of:

providing a wiring pattern on the substrate with a conductive paste and baking the wiring pattern of the conductive paste to form the first wiring;

coating part of the first wiring at the crossing point with an insulating paste and baking the insulating paste to form a first insulating layer, the coating thickness of the insulating paste being controlled so that the height of the first insulating layer formed adjacent to sidewalls of the first wiring at the crossing point is substantially equal to the height of the first wiring;

forming a second insulating layer on the first insulating layer and the first wiring at the crossing point; and forming a second wiring which crosses over the second insulating layer to intersect with the first wiring.

Further, there is provided a method of manufacturing an electron source substrate on which a first and second wirings connected to an electron emission device intersect with each other at a crossing point, comprising the steps of:

providing a wiring pattern on the substrate and baking the wiring pattern to form the first wiring the sidewall of which is undercut;

coating part of the first wiring at the crossing point with an insulating paste and baking the insulating paste to form a first insulating layer, the coating thickness of the insulating paste being controlled so that the height of the first insulating layer formed adjacent to sidewalls of the first wiring at the crossing point is substantially equal to the height of the first wiring;

forming a second insulating layer on the first insulating layer and the first wiring at the crossing point;

forming a second wiring which crosses over the second insulating layer to intersect with the first wiring; and forming the electron emission device so as to be connected to said first and second wirings.

Further, an electron source substrate according to the present invention is characterized in that the electron source substrate is manufactured by the above-mentioned manufacturing method.

Further, according to the present invention, there is provided an image forming apparatus, characterized in that the apparatus is manufactured by the above-mentioned manufacturing method.

BRIEF DESCRIPTION OF THE DRAWINGS

FIGS. 1A, 1B, 1C, 1D, 1E, 1F, 1G, 1H, 1I and 1J are schematic views showing a process of manufacturing a wiring substrate according to a first example of the present invention.

FIGS. 2A, 2B, 2C, 2D, 2E, 2F, 2G, 2H, 2I and 2J are schematic views showing a process of manufacturing a wiring substrate according to a second example of the present invention.

FIGS. 4A and 4B are its plan view and its front view, respectively.

FIGS. 9A, 9B, 9C, 9D, 9E, 9F, 9G, 9H, 9I and 9J are schematic views showing a conventional process of manufacturing a wiring substrate.

DESCRIPTION OF THE PREFERRED EMBODIMENTS

Figure 3A:
FIGS. 3A, 3B and 3C are drawings for explaining a method of forming a surface-conduction-type electron emission device.

More concretely explaining the defects in the conventional way, when the wirings and insulating layers are arranged, there is the following problem. Particularly, when, for example, using a printing paste provided with photosensitivity for the purposes of reducing resistance and increasing definition, the following problem tends to occur in the case where the wiring located under the insulating layer has a shape such as spread upward from the substrate surface. The detailed description is given with reference to FIGS. 9A to 9J as follows.

In the case where two insulating layers are formed, for example, as shown in FIGS. 9A to 9J, parts of matrix wirings at crossing points are formed using a photosensitive metal paste by a method including: forming a first thick-film wiring 105 on a substrate 101 (FIGS. 9A to 9J); forming insulating layers 119 and 121 thereon each of which is formed by sequentially carrying out deposition, drying, exposure, development, and baking steps; and forming a second wiring 106 superimposed thereon.

In the step of forming the insulating layer 119 on the first wiring 105 (FIGS. 9E to 9H), a structure that tends to contain air bubbles 120 is formed due to the configuration of the edges (the shape such as spread upward from the substrate surface due to edge curl or the like) of the first wiring 105.

Afterward, the insulating layer 121 is formed on the insulating layer 119 containing the air bubbles 120 to cover it and thus contains air bubbles 120. Holes resulted from the air bubbles cannot be filled up completely. As a result, after the formation of the second wiring 106, the defect of short-circuit between the upper and lower wirings (the first wiring 105 and the second wiring 106) may be caused in some cases (FIG. 9J).

A preferred embodiment of the present invention will be described with reference to the drawings as follows. The present invention is particularly effective when being applied to a self-emission-type flat image forming apparatus with a large-area screen. Hence, the following illustrative description is directed to a configuration obtained when the present invention is applied to an image forming apparatus with a surface-conduction-type electron emission device.

Further, besides the above-mentioned surface-conduction-type electron emission device, the present invention also can be applied suitably to, for example, a method of forming wirings of an electron source substrate or image forming apparatus with a field-emission-type electron emission device (FE) or an MIM-type electron emission device.

In the surface-conduction-type electron emission device, voltage is applied to an electroconductive thin film formed on a substrate from a pair of electrodes called "device electrodes" and thereby electrons are emitted into a vacuum from an electron emitting portion formed in a part of the electroconductive film.

The principle of the image forming apparatus with a surface-conduction-type electron emission device is described as follows. That is, an image is formed by irradiation of image forming members such as fluorescent substances with electrons emitted from the surface-conduction-type electron emission device.

Figure 3B:
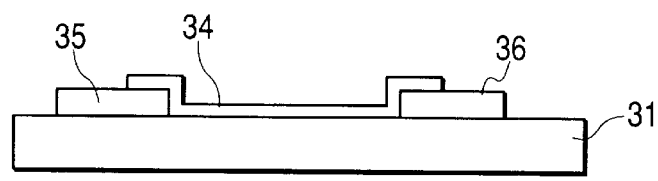
Figure 3C:
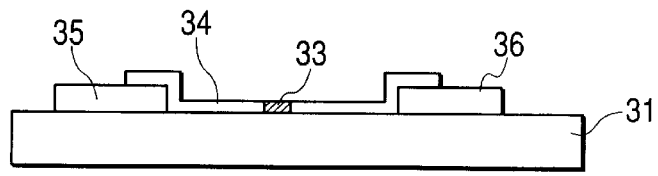
Figure 4A:
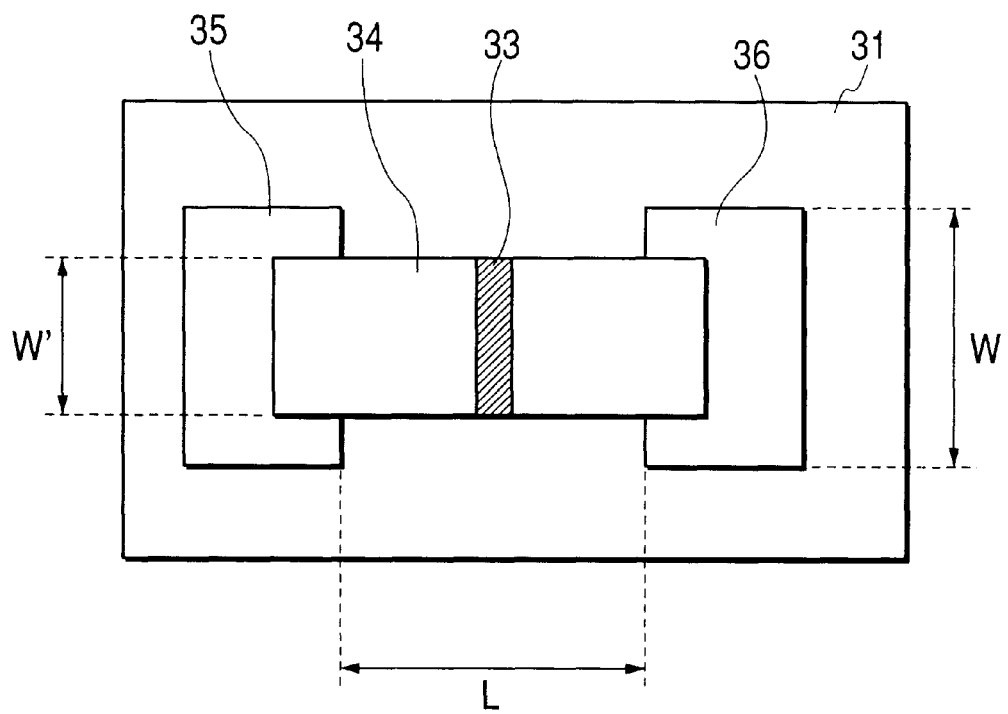
FIGS. 4A and 4B are schematic views showing a surface-conduction-type electron emission device.
Figure 4B:
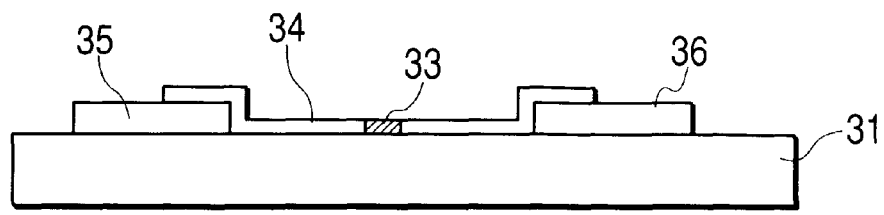

FIGS. 3A to 3C are drawings for explaining a method of forming a surface-conduction-type electron emission device. FIGS. 4A and 4B are a plan view and a sectional view, respectively, showing the surface-conduction-type electron emission device.

An example of a method of forming the device is described with reference to FIGS. 3A to 3C and FIGS. 4A and 4B. The following description is directed to an example of a method of forming a single device.

(1) An insulating substrate 31 is washed sufficiently with a detergent, pure water, and an organic solvent and then device electrodes 35 and 36 are formed on the surface of the insulating substrate 31 by vacuum deposition and photolithographic techniques (FIG. 3A). Any material with electroconductivity may be used as materials for the device electrodes 35 and 36. Examples of the material include nickel metal. With respect to the size of the device electrodes 35 and 36, for example, the distance L between the device electrodes is 10 $\mu$m, and each of the device electrodes 35 and 36 has a length W of 300 $\mu$m and a film thickness d of 100 nm. There is no problem even when using a thick film printing process as a method of forming the device electrodes (electrodes in the vicinity of the electron emitting portion) 35 and 36. Materials used when the printing process is employed include, for example, an organometallic paste (MOD).

(2) An organometallic solution is applied onto the insulating substrate 31, having the device electrodes 35 and 36 formed thereon, between the device electrodes 35 and 36 formed on the insulating substrate 31, which then is left standing. Thus, an organometallic thin film is formed. In this case, the organometallic solution is a solution of an organic compound containing metal such as Pd, Ru, Ag, Au, Ti, In, Cu, Cr, Fe, Zn, Sn, Ta, W, Pb, or the like as a main element. Afterward, the organometallic thin film is subjected to a heat baking treatment and then to patterning by lift-off, etching, or the like. Thus, a thin film 34 used for forming the electron emitting portion is formed (FIG. 3B).

(3) Subsequently, voltage is applied between the device electrodes 35 and 36 by an energization process called "forming", and thereby an electron emitting portion 33 with a modified structure is formed in a portion corresponding to the thin film 34 used for forming the electron emitting portion (FIG. 3C). This energization process allows the thin film 34 to be locally damaged, deformed, or modified. The part of the thin film 34 with an altered film property thus obtained is called the electron emitting portion 33.

Figure 5A:
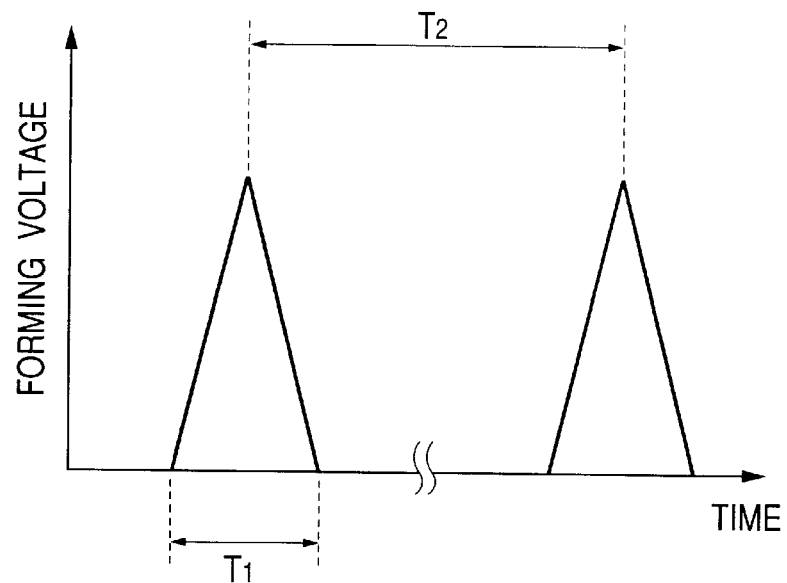
FIGS. 5A and 5B show examples of the waveform of forming voltage applied in forming an electron emitting portion of a surface-conduction-type electron emission device.
Figure 5B:
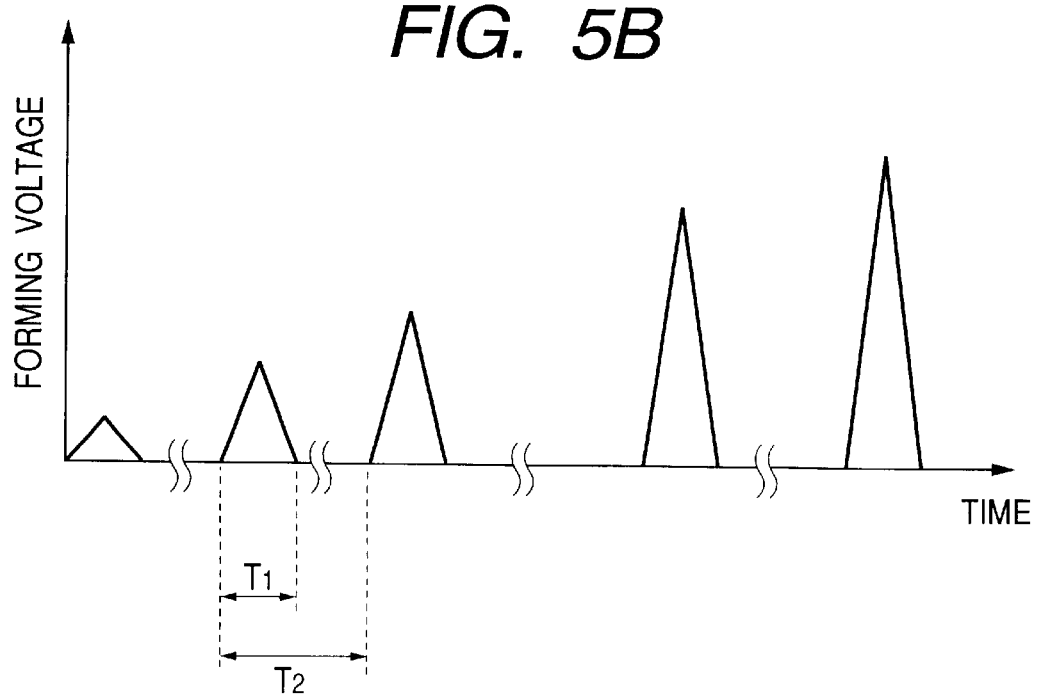

FIGS. 5A and 5B show waveforms of the voltage applied in the forming process.

In FIGS. 5A and 5B, reference symbols T1 and T2 indicate a pulse width and a pulse interval of each voltage waveform, respectively. T1 is set suitably to 1 microsecond to 10 milliseconds; T2, to 10 microseconds to 100 milliseconds; and the peak voltage of a triangular wave (applied during the forming process), to about 4 V to 10 V. In addition, the forming process is set suitably to be carried out for several tens of seconds under a vacuum atmosphere.

When the electron emitting portion described above is formed, the forming process is carried out through application of triangular-wave pulses between the device electrodes. However, the waveform of the voltage to be applied between the device electrodes is not limited to the triangular wave. A desired waveform such as a rectangular wave or the like may be used. In addition, its peak value, its pulse width, its pulse interval, and the like also are not limited to the above-mentioned value. For example, the peak value may be constant as shown in FIG. 5A or may increase gradually as shown in FIG. 5B. Any desired values can be selected as long as the electron emitting portion is formed in a good condition.

Afterward, an energization process called "activation" is carried out. This is a process for depositing carbon or a carbon compound on the electron emitting portion formed by the above-mentioned forming process. With this process, the electron emission characteristics are improved.

The basic characteristics of the electron emission device according to the present embodiment that has the device structure described above and is produced by the above-mentioned manufacturing method are described with reference to FIGS. 6 and 7.

Figure 6:
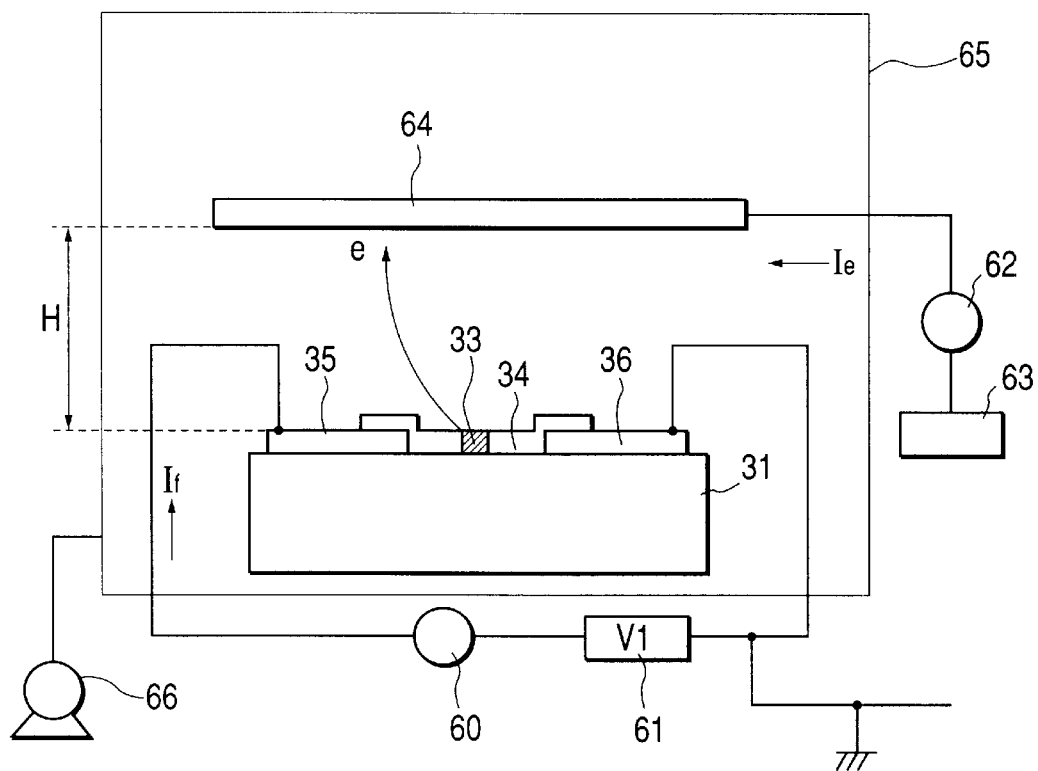
FIG. 6 is a schematic structural view showing a measurement/evaluation device for determining electron emission characteristics of a surface-conduction-type electron emission device.

FIG. 6 is a schematic structural view showing a measurement/evaluation device for determining electron emission characteristics of a device with the configuration shown in FIGS. 4A and 4B. In FIG. 6, reference numeral 31 indicates an insulating substrate; 35 and 36, device electrodes; 34, a thin film used for forming an electron emitting portion; and 33, an electron emitting portion.

In addition, reference numeral 61 denotes a power supply for applying a device voltage Vf to the device; 60, an ammeter for measuring a device current If flowing through the electroconductive film 34 including the electron emitting portion 33 between the device electrodes 35 and 36; 64, an anodic electrode for capturing an emission current Ie emitted from the electron emitting portion of the device; 63, a high-voltage power supply for applying voltage to the anodic electrode 64; and 62, an ammeter for measuring the emission current Ie emitted from the electron emitting portion 33 of the device.

When the above-mentioned device current If and emission current Ie in the electron emission device are to be measured, the power supply 61 and the ammeter 60 are connected to the device electrodes 35 and 36, and the anodic electrode 64 connected to the power supply 63 and the ammeter 62 is placed above the electron emission device. The electron emission device and the anodic electrode 64 are placed inside vacuum equipment 65. The vacuum equipment 65 is provided with devices required for vacuum equipment such as, for instance, an exhaust pump 66 and a vacuum gauge and thus is in a condition that allows measurement and evaluation of the device to be carried out under a desired vacuum. In this case, the measurement was carried out with the voltage of the anodic electrode 64 set to 1 to 10 kV and the distance H between the anodic electrode 64 and the electron emission device set so as to fall within a range of 3 to 8 mm.

Figure 7:
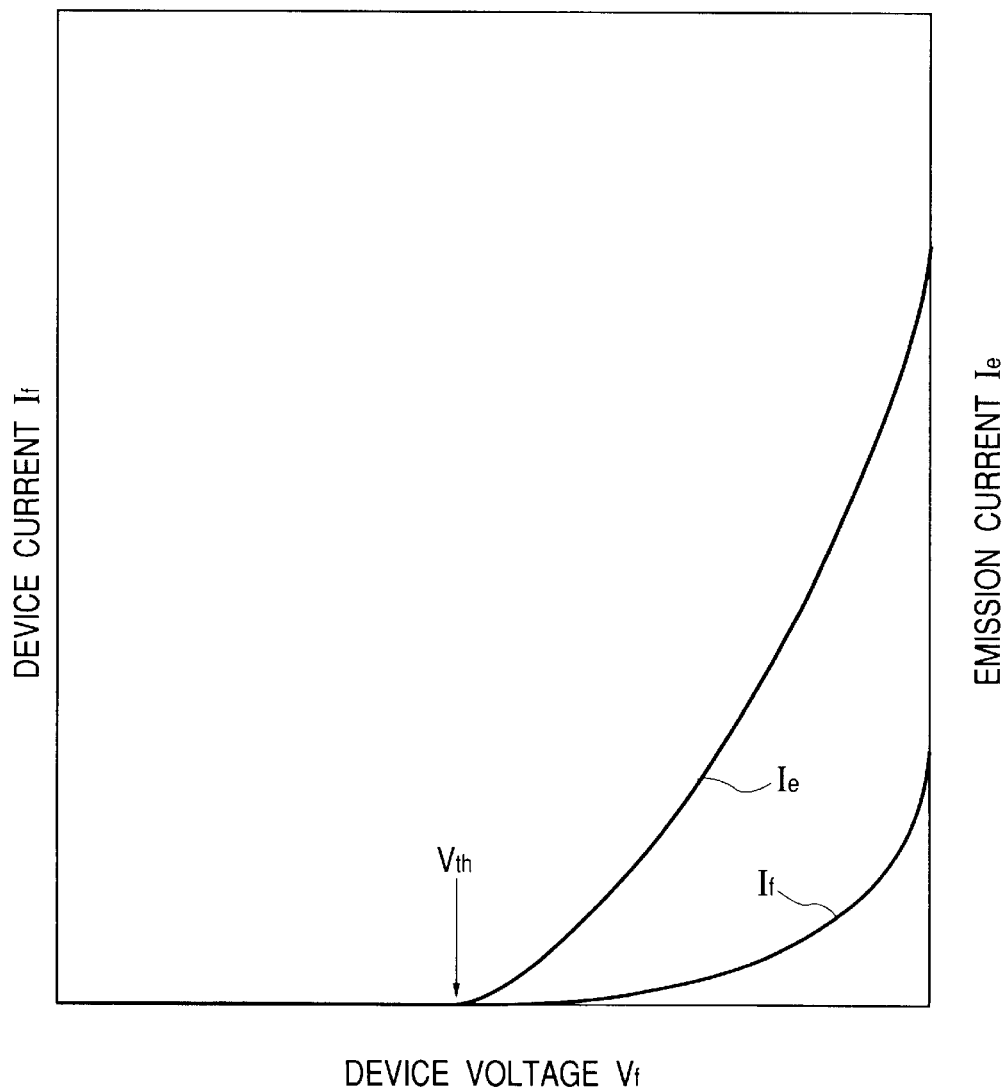
FIG. 7 is a graph for explaining electron emission characteristics of a surface-conduction-type electron emission device.

FIG. 7 shows a typical example of the relationship between the device voltage Vf and the emission and device currents Ie and If measured by the measurement/evaluation device shown in FIG. 6. FIG. 7 is shown with arbitrary units. As also is apparent from FIG. 7, the electron emission device has three characteristics with respect to the emission current Ie.

First, when a device voltage equal to or higher than a certain voltage (called a "threshold voltage" and indicated with "Vth" in FIG. 7) is applied to the device, the emission current Ie increases rapidly. On the other hand, when the device voltage is lower than the threshold voltage, the emission current Ie hardly is detected. In other words, the present device is a non-linear device with a specific threshold voltage Vth with respect to the emission current Ie.

Second, the emission current Ie can be controlled by the device voltage Vf since the emission current Ie depends on the device voltage Vf.

Third, the amount of electric charges to be captured by the anodic electrode 64 can be controlled by means of the period of time for which the device voltage Vf is applied.

The electron emission device according to the present embodiment has the characteristics as described above and thus is expected to be applied to various fields.

Further, a surface-conduction-type electron emission device formed with dispersed conductive fine particles can be produced even when a partial change is made in the basic method of manufacturing the basic device configuration of the present embodiment.

Figure 8:
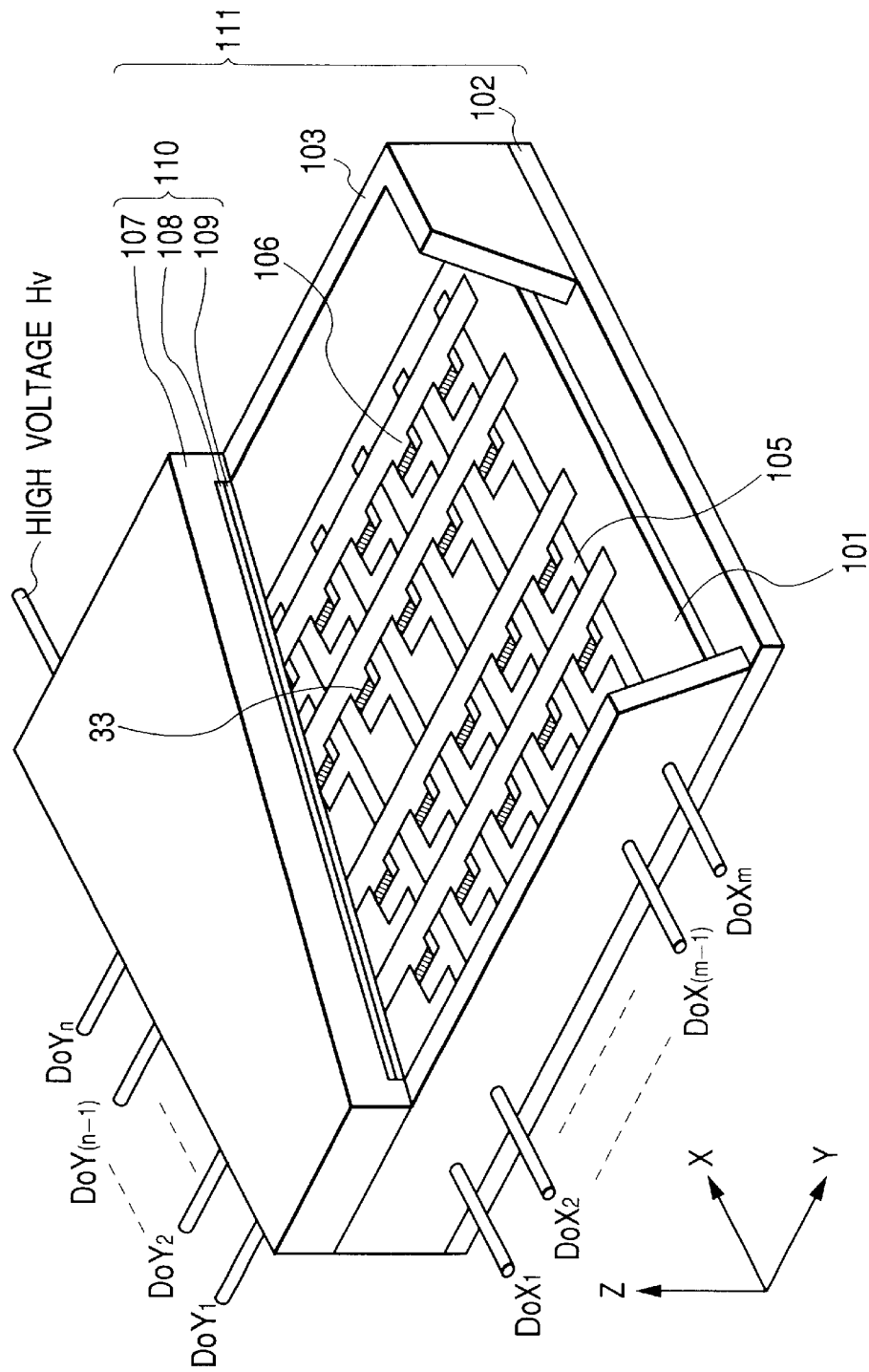
FIG. 8 is a perspective view showing a schematic configuration of a self-emission-type flat image forming apparatus.

FIG. 8 is a schematic structural view showing an example of an image display device with surface-conduction-type electron emission devices.

An envelope (an airtight container) 111 for keeping the interior of the image display device vacuum is formed with respective joint portions between a rear plate 102 and a support frame 103 and between the support frame 103 and a face plate 110 sealed with an adhesive such as low melting point glass frit or the like that is not shown in the figure.

A substrate 101 is fixed to the rear plate 102. N×M surface-conduction-type electron emission devices are formed and arranged on the substrate 101 (where N and M are positive integers of at least 2 and are set suitably according to the intended number of display pixels).

After the substrate 101 is fixed onto the rear plate 102, the face plate 110 (that is formed with a fluorescent film 108 and a metal back 109 formed sequentially on the inner face of a glass substrate 107) is placed above the substrate 101 with a spacing of 5 mm, the support frame 103 being provided therebetween. Then, frit glass is applied to the joint portions between the face plate 110 and the support frame 103 and between the support frame 103 and the rear plate 102 and then is baked in the atmosphere or a nitrogen atmosphere at a temperature of 400° C. to 500° C. for at least 10 minutes. Thus, the envelope is sealed.

Similarly, the substrate 101 is fixed to the rear plate 102 with frit glass.

In FIG. 8, reference numeral 33 indicates an electron emitting portion; 105, a first wiring as an X-direction device electrode; and 106, a second wiring as a Y-direction device electrode.

In this case, the envelope 111 is formed of the face plate 110, the support frame 103, and the rear plate 102. However, since the main purpose of providing the rear plate 102 is to increase the strength of the substrate 101, a separate rear plate 102 is not necessary when the substrate 101 itself has sufficiently high strength. The envelope 111 may be formed of the face plate 110, the support frame 103, and the substrate 101 with the support frame 103 sealed directly to the substrate 101.

Usually, the metal back 109 is provided on the inner face side of the fluorescent film 108. The metal back 109 is provided for the purposes of: for example, increasing brightness by mirror-reflecting light emitted from fluorescent substances toward the inner face side of the fluorescent film so as to direct the light to the face plate 110 side; being used as an electrode for applying an electron beam acceleration voltage; and protecting the fluorescent substances from damages caused by collision of negative ions produced inside the envelope.

The metal back 109 is formed as follows: after the formation of the fluorescent film, the inner face of the fluorescent film is subjected to a smoothing process (generally referred to as "filming"), and then Al is vacuum-deposited thereon. Furthermore, in order to improve the electroconductivity of the fluorescent film 108 of the face plate 110, a transparent electrode (not shown in the figure) may be provided on the outer face side of the fluorescent film 108 in some cases.

When the above-mentioned sealing is carried out, it is necessary to adjust positions of the fluorescent substances corresponding to respective colors and electron emission devices to a sufficient degree in the case of a color image display device.

The atmosphere inside the glass container thus formed is evacuated through an exhaust pipe (not shown in the figure) with a vacuum pump until it reaches a sufficient degree of vacuum. Afterward, voltage is applied between the first wiring 105 and the second wiring 106 through external terminals $D_0x_1$ to $D_0x_m$ and $D_0y_1$ to $D_0y_n$ that are provided outside the container. Thus, the above-mentioned forming process is implemented to form the electron emitting portions 33 and thus the electron emission devices are produced.

Eventually, while a vacuum of about $10^{-6}$ Torr ($1.33 \times 10^4$ Pa) is maintained, the exhaust pipe is heated to be welded and thus the envelope is sealed to be completed. Furthermore, in order to maintain the vacuum after the sealing, a step of a getter process is carried out. This is a process of forming a getter deposition film by heating a getter disposed in a predetermined position (not shown in the figure) of the image display device by resistance heating or high-frequency heating directly before or after the sealing. Generally, the getter is one containing, for example, Ba as a main component and allows the vacuum to be maintained through adsorption function of the deposition film.

In an image display device formed by the manufacturing method described above, voltage is applied to the respective electron emission devices through the external terminals $D_0x_1$ to $D_0x_m$ and $D_0y_1$ to $D_0y_n$ to allow the respective electron emission devices to emit electrons.

In other words, a voltage is applied sequentially to the external terminals $D_0x_1$ to $D_0x_m$ corresponding to scanning lines for each one horizontal period of an image signal, and a signal voltage corresponding to the intensity of the image signal in a scanning line selected in the horizontal period is applied sequentially to the external terminals $D_0y_1$ to $D_0y_n$.

Hence, a voltage corresponding to the intensity of the image signal is applied to both ends of each electron emission device connected to a selected external terminal $D_0x_i$ (1<i<m) and thus electrons according to the intensity of the image signal are emitted. Further, the external terminals $D_0x_1$ to $D_0x_m$ and $D_0y_1$ to $D_0y_n$ may be used substituting for each other.

A high voltage of at least several kilovolts is applied to the metal back 109 or the transparent electrode through a high-voltage terminal Hv, so that electron beams are accelerated to collide with the fluorescent film 108. Thus, the fluorescent substances are excited and are allowed to emit light and thereby an image is formed. Of course, the configuration described above is a schematic configuration required for forming an image forming apparatus, and the materials for the respective members and the like are not limited to those described above.

The fluorescent film 108 is made of fluorescent substances alone in the case of monochrome display. In the case of color display, however, the fluorescent film 108 is made of fluorescent substances and a black member that is called "black striping" or "black matrix" depending on the arrangement of the fluorescent substances.

The purposes of providing the black member are: to prevent a mixed colors or the like unobtrusive by blackening coloring border portions between respective fluorescent substances of three primary colors required in the case of color display; and to prevent degradation in contrast due to reflection of external light in the fluorescent film 108. Generally, many of the black materials used as the material for the black member contain graphite as a main component. However, the material is not limited to those as long as it has electroconductivity and low light transmissivity and reflectivity.

Examples of the method of applying fluorescent substances to the glass substrate 107 include a precipitation method and a printing process in the case of monochrome display and a slurry process in the case of color display. Of course, it also is possible to use the printing process in the case of color display.

As shown in FIG. 8, the surface-conduction-type electron emission devices are wired with the first wiring 105 formed of M row-direction wiring lines and the second wiring 106 formed of N column-direction wiring lines. It is necessary to form an interlayer insulating layer (not shown in the figure) between the first and second wirings at crossing points where the first wiring 105 and the second wiring 106 intersect with each other to secure electrical insulation between the first and second wirings 105 and 106.

The part including the substrate 101, a plurality of electron emission devices such as surface-conduction-type electron emission devices, the first wiring 105 in the row direction, and the second wiring 106 in the column direction is referred to as an "electron source" or a "multi electron beam source".

In order to form an image display device (an image forming apparatus) using the above-mentioned electron source, it is necessary to form and arrange many electron emission devices and first and second wirings. Hence, a preferable method of manufacturing the wirings is a method in which printing technique is applied, which is a method that requires no vacuum equipment and the like, can be carried out relatively inexpensively, and can also be adapted for a large-area screen.

According to the present embodiment, a wiring substrate, an electron source substrate, and an image forming apparatus in which no defect of short-circuit between wirings is caused are obtained by using a photosensitive insulating paste and a photosensitive conductive paste (a photosensitive metal paste), each of which is prepared through impartation of a photosensitive characteristic to a paste, and further by devising deposition, exposure, development, and baking steps, for the purpose of increasing definition and location accuracy of the first wiring 105 in the row direction and the second wiring 106 in the column direction.

A detailed method of manufacturing a wiring substrate according to the present embodiment is described with reference to FIGS. 1A to 1J as follows. FIGS. 1A to 1J are sectional views schematically showing steps of lamination formation of the wiring substrate at crossing points where the first and second wirings intersect with each other.

First, a photosensitive conductive paste 12 containing photosensitive material and conductive particles is applied onto a substrate 11 and is dried as required (FIG. 1A).

Next, the photosensitive conductive paste 12 thus applied and dried is exposed into a desired pattern and thereby a latent image 15 is formed (FIG. 1B). The exposure is carried out, for example, by irradiation with exposure light 14 such as ultraviolet light through a mask 13 with openings corresponding to the desired pattern.

Subsequently, a development step is carried out in which in the photosensitive conductive paste 12 thus exposed, its exposed regions are left and its non-exposed regions are removed. Thus, a development pattern 16 is formed (FIG. 1C). In this case, a negative-type photosensitive material was used. However, it is to be understood that a positive-type photosensitive material also may be used.

Next, organic substances contained in the paste are removed by baking and thus the first wiring (a lower side wiring) 17 is formed (FIG. 1D).

Next, a photosensitive insulating paste 18 is applied so as to coat parts of the first wiring 17 at crossing points that are to intersect with the second wiring to be formed in the later step and then is dried (FIG. 1E). In this case, the photosensitive insulating paste was used that was obtained through addition of photosensitive material to an insulating paste. However, it is not always necessary to add the photosensitive material.

Similarly to the case of forming the first wiring 17, desired regions of the photosensitive insulating paste 18 corresponding to the crossing points are exposed through a mask 21 with a desired pattern of openings. Thus, a latent image 23 is formed (FIG. 1F).

Furthermore, a development step is carried out in which only exposed regions of the photosensitive insulating paste 18 are left and the other regions thereof are removed. Thus, a development pattern 24 is formed (FIG. 1G).

Next, baking is carried out to form an insulating layer 19 (a first insulating layer) (FIG. 1H). In the baking step, air bubbles were produced along the edges of the first wiring 17 and thereby concave portions 25 were formed in the insulating layer 19.

The insulating layer 19 formed by this baking step has a height (thickness) substantially equal to or slightly lower than that of the first wiring 17 and is formed on both sides of the first wiring 17 to sandwich each crossing point.

In other words, the film thickness is set to a desired value in the deposition step (shown in FIG. 1E), and thus the insulating layer 19 obtained after the baking is allowed to have a film thickness equal to or thinner than that of the first wiring 17. This can prevent air bubbles from being contained in the insulating layer.

Subsequently, an insulating layer 25 (a second insulating layer) is formed on the insulating layer 19 and the first wiring 17 to cover parts of the first wiring 17 at the above-mentioned crossing points in the same manner as in the steps shown in FIGS. 1E to 1H described above (FIG. 1I). With this step, the concave portions 25 formed in the insulating layer 19 are filled with the insulating layer 25.

In this case, the insulating layers are formed as a two-layer structure. However, the number of layers to be laminated may be increased and each of the first and second insulating layers may be formed to have a multilayer structure.

Next, the second wiring (upper-side wiring) 26 is formed on the insulating layer 25 (FIG. 1J). The second wiring 26 can be formed by various manufacturing methods. However, it is preferable to form it by a printing process using a conductive paste containing conductive particles. It is further preferable to use a photosensitive conductive paste containing photosensitive material as in the case of the first wiring 17 since the use of it allows the wiring to have lower resistance and higher definition.

The lamination of the first wiring, the insulating layers, and the second wiring as described above permits the formation of a wiring substrate in which the electrical insulation between the first and second wirings is secured to a sufficient degree. Furthermore, the application of this manufacturing method to the wirings for driving the electron emission devices described above allows an electron source substrate and an image forming apparatus in which no defect of short-circuit is caused to be obtained.

EXAMPLES

Preferred examples of the present invention will be described illustratively in detail with reference to the drawings as follows.

First Example

FIGS. 1A to 1J are schematic views showing a process of manufacturing a wiring substrate with two insulating layers formed therein according to a first example of the present invention.

In the figures, reference numeral 11 indicates a substrate; 12, a photosensitive conductive paste; 13, a mask; 14, exposure light; 15, a latent image; 16, a development pattern; and 17, a first wiring. FIGS. 1A to 1D show states after deposition, exposure, development, and baking of the photosensitive conductive paste 12, respectively.

In the present example, a method of forming thick film wirings and insulating layers on the substrate is described.

FIGS. 1A to 1D sequentially show deposition, exposure, development, and baking steps for forming a wiring pattern. In FIG. 1A, soda-lime glass was used for the substrate 11, and the photosensitive conductive paste 12 was applied to the substrate 11 by screen printing employed as a deposition method.

The photosensitive conductive paste contains silver particles as a main component in a component percentage of about 60 to 80% and a remaining component of a glass component, organic component which includes photosensitive material, glass frit and solvent component in a component percentage of about 20 to 40%.

This photosensitive conductive paste having electroconductivity was printed by screen printing. Various printing blocks of #150 to 400 mesh may be used selectively depending on the thickness of the conductive paste to be deposited. In this case, the deposition was carried out using a printing block of #200 mesh so that the conductive paste had a film thickness of slightly thicker than 20 µm after being dried.

Thereafter, drying was carried out at 80 to 150° C. to dry the photosensitive conductive paste 12. After the drying, the film thickness was about 20 µm.

Next, in the step shown in FIG. 1B, exposure was carried out so as to expose desired regions using the mask 13 having a desired wiring pattern. In this step, as shown in FIG. 1B, the exposure light 14 passed through openings of the mask 13, and the desired regions of the photosensitive conductive paste 12 were exposed. Thus, a latent image 15 corresponding to the openings of the mask 13 was formed.

In the step shown in FIG. 1C, the photosensitive conductive paste 12 with a height of about 20 µm was developed. The developing method may be selected suitably depending on the photosensitive conductive paste which is used. In this example, after completion of the development with a weakly alkaline solution, the development was stopped by rinsing with pure water, and then drying was carried out by blowing. Thus, a development pattern 16 as shown in FIG. 1C was formed.

Further, as shown in FIG. 1D, baking was carried out to form a first wiring 17 with a desired wiring pattern. In this case, the baking was carried out at about 500° C. After the baking, the film thickness was about 10 µm. Note that the wiring had a sectional shape broadening upward from the substrate upper face (i.e. a sectional shape side portions of which are undercut) as shown in FIG. 1D. The upper edges of the wiring were in a curled form (not shown in the figure).

Next, the description will be made of a method of forming an insulating layer pattern on the wiring pattern with reference to FIGS. 1E to 1H. FIGS. 1E to 1H sequentially show deposition, exposure, development, and baking steps for forming the insulating layer pattern as in the method of forming the wiring pattern described above. A photosensitive insulating paste 18 was applied to the substrate 11 by screen printing employed as a deposition method (FIG. 1E).

The photosensitive insulating paste contains glass particles as a main component in a component percentage of about 60 to 80% and a remaining component of an organic component which includes photosensitive material and solvent component in a component percentage of about 20 to 40%.

This photosensitive insulating paste was printed by screen printing. Various printing blocks of #150 to 400 mesh may be used selectively depending on the thickness of the insulating paste to be deposited. In this case, the deposition was carried out using a printing block of #200 mesh so that the insulating paste had a film thickness of slightly thicker than 20 µm after being dried.

Thereafter, drying was carried out at 80 to 150° C. to dry the photosensitive insulating paste 18. After the drying, the film thickness was about 20 µm.

Next, in the step shown in FIG. 1F, exposure was carried out to expose desired regions using the mask 21 with a desired insulating layer pattern. In this step, as shown in FIG. 1F, exposure light 22 passed through openings of the mask 21 and thereby the photosensitive insulating paste 18 were exposed. Thus, a latent image 23 corresponding to the openings of the mask 21 was formed.

In the step shown in FIG. 1G, the photosensitive insulating paste 18 with a height of about 20 µm was developed. The developing method may be selected suitably depending on the photosensitive insulating paste used. In this example, after completion of the development with a weakly alkaline solution, the development was stopped by rinsing with pure water, and then drying was carried out by blowing. Thus, a development pattern 24 as shown in FIG. 1G was formed.

Further, as shown in FIG. 1H, baking was carried out to form an insulating layer 19 (a first insulating layer) with a desired insulating layer pattern. In this case, the baking was carried out at about 500° C. After the baking, the film thickness was about 10 µm and was substantially the same as the film thickness of the first wiring 17.

In this case, air bubbles produced in the vicinity of the curled edge portions of the first wiring 17 were not contained in the layer but remained as concave portions 20 having their openings at the surface of the insulating layer 19. While not shown in FIG. 1H, the insulating layer 19 is formed on the upper serface of the first wiring 17.

In addition, an insulating layer 25 (a second insulating layer) was formed as shown in FIG. 1I through implementation of the same steps as those shown in FIGS. 1E to 1H. These steps allowed the insulating layer 25 to fill the concave portions 20 in the insulating layer 19.

Subsequently, as shown in FIG. 1J, a second wiring 26 was formed on the insulating layer 25. In the present example, a conductive paste was applied by screen printing, was dried, and was baked, and thus the second wiring 26 was formed.

In the wiring substrate of the present example formed by the above-mentioned steps, no short-circuit between the upper and lower wirings (the first wiring 17 and the second wiring 26) was caused, and sufficiently high electrical insulation therebetween was secured. Similarly, excellent operations with no short-circuit caused were confirmed in an electron source with electron emission devices to be connected to the wirings formed by the above-mentioned method and an image forming apparatus using this electron source.

Second Example

FIGS. 2A to 2J are schematic views showing a process of manufacturing a wiring substrate with three insulating layers formed therein according to a second example of the present invention.

In the figures, reference numeral 11 indicates a substrate; 12, a photosensitive conductive paste; 13, a mask; 14, exposure light; 15, a latent image; 16, a development pattern; and 17, a first wiring. FIGS. 2A to 2D show states after deposition, exposure, development, and baking of the photosensitive conductive paste 12, respectively.

In the present example, a method of forming thick film wirings and insulating layers on the substrate is described.

FIGS. 2A to 2D sequentially show deposition, exposure, development, and baking steps for forming a wiring pattern. In FIG. 2A, soda-lime glass was used for the substrate 11, and the photosensitive conductive paste 12 was applied to the substrate 11 by screen printing employed as a deposition method.

The photosensitive conductive paste contains silver particles as a main component in a component percentage of about 60 to 80% and a remaining component of a glass component, organic component which includes photosensitive material, glass frit and a solvent component in a component percentage of about 20 to 40%.

This photosensitive conductive paste having electroconductivity was printed by screen printing. Various printing blocks of #150 to 400 mesh may be used selectively according to the thickness of the conductive paste to be deposited. In this case, the deposition was carried out using a printing block of #200 mesh so that the conductive paste had a film thickness of slightly thicker than 20 μm after being dried.

Thereafter, drying was carried out at 80 to 150° C. to dry the photosensitive conductive paste 12. After the drying, the film thickness was about 20 μm.

Next, in the step shown in FIG. 2B, exposure was carried out so as to expose desired regions using the mask 13 having a desired wiring pattern. In this step, as shown in FIG. 2B, the exposure light 14 passed through openings of the mask 13, and the desired regions of the photosensitive conductive paste 12 were exposed. Thus, a latent image 15 corresponding to the openings of the mask 13 was formed.

In the step shown in FIG. 2C, the photosensitive conductive paste 12 with a height of about 20 μm was developed. The developing method may be selected suitably depending on the photosensitive conductive paste which is used. In this example, after completion of the development with a weakly alkaline solution, the development was stopped by rinsing with pure water, and then drying was carried out by blowing. Thus, a development pattern 16 as shown in FIG. 2C was formed.

Further, as shown in FIG. 2D, baking was carried out to form a first wiring 17 with a desired wiring pattern. In this case, the baking was carried out at about 500° C. After the baking, the film thickness was about 10 μm. Note that the wiring had a sectional shape broadening upward from the substrate upper face (i.e. a sectional shape side portions of which are undercut) as shown in FIG. 2D. The upper edges of the wiring were in a curled form (not shown in the figure).

Next, the description will be made of a method of forming an insulating layer pattern on the wiring pattern with reference to FIGS. 2E to 2H. FIGS. 2E to 2H sequentially show deposition, exposure, development, and baking steps for forming the insulating layer pattern as in the method of forming the wiring pattern described above. A photosensitive insulating paste 18 was applied to the substrate 11 by screen printing employed as a deposition method (FIG. 2E).

The photosensitive insulating paste contains glass particles as a main component is a component percentage of about 60 to 80% and a remaining component of an organic component which includes photosensitive material and solvent component in a component percentage of about 20 to 40%.

This photosensitive insulating paste was printed by screen printing. Various printing blocks of #150 to 400 mesh may be used selectively depending on the thickness of the insulating paste to be deposited. In this case, the deposition was carried out using a printing block of #325 mesh so that the insulating paste had a film thickness of slightly thicker than 10 μm after being dried.

Thereafter, drying was carried out at 80 to 150° C. to dry the photosensitive insulating paste 18. After the drying, the film thickness was about 10 μm.

Next, in the step shown in FIG. 2F, exposure was carried out to expose desired regions using the mask 21 with a desired insulating layer pattern. In this step, as shown in FIG. 2F, exposure light 22 passed through openings of the mask 21 and thereby the photosensitive insulating paste 18 were exposed. Thus, a latent image 23 corresponding to the openings of the mask 21 was formed.

In the step shown in FIG. 2G, the photosensitive insulating paste 18 with a height of about 10 μm was developed. The developing method may be selected suitably depending on the photosensitive insulating paste used. In this example, after completion of the development with a weakly alkaline solution, the development was stopped by rinsing with pure water, and then drying was carried out by blowing. Thus, a development pattern 24 as shown in FIG. 2G was formed.

Further, as shown in FIG. 2H, baking was carried out to form an insulating layer 19 with a desired insulating layer pattern. In this case, the baking was carried out at about 500° C. After the baking, the film thickness was about 5 μm and was substantially half the film thickness of the first wiring 17.

In this case, air bubbles produced in the vicinity of the curled edge portions of the first wiring 17 were not contained in the layer but remained as concave portions 20 having their openings at the surface of the insulating layer 19.

In addition, an insulating layer 27 was formed as shown in FIG. 2I through implementation of the same steps as those shown in FIGS. 2E to 2H. These steps allowed the insulating layer 27 to fill the concave portions 25 in the insulating layer 19 while causing new concave portions 20 to be formed in the insulating layer 27.

The height of the insulating layer 27 after the baking was substantially the same as that of the first wiring 17. In the present example, a first insulating layer was formed of the two insulating layers, i.e. the insulating layers 19 and 27.

Subsequently, an insulating layer 28 (a second insulating layer) was formed as shown in FIG. 2J through the implementation of the same steps as those shown in FIGS. 2E to 2H. The insulating layer 28 was formed to have a film thickness of 10 μm after being baked. These steps allowed the insulating layer 28 to fill the concave portions 20 in the insulating layer 27.

Subsequently, as shown in FIG. 2J, a second wiring 26 was formed on the insulating layer 28. In the present example, a conductive paste was applied by screen printing, was dried, and was baked and thus the second wiring 26 was formed.

In the wiring substrate of the present example formed by the above-mentioned steps, no short-circuit between the upper and lower wirings (the first wiring 17 and the second wiring 26) was caused and sufficiently high electrical insulation therebetween was secured. Similarly, excellent operations with no short-circuit caused were confirmed in an electron source with electron emission devices to be connected to the wirings formed by the above-mentioned method and an image forming apparatus with this electron source.

As described above, the present invention allows a wiring substrate, an electron source substrate, and an image forming apparatus to be obtained that can prevent the defect of short-circuit between wirings that are laminated to be formed, can secure sufficiently high electrical insulation between the wirings, and have high reliability.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of manufacturing a substrate on which a first wiring and a second wiring intersect with each other at a crossing point, comprising the steps of:

providing a wiring pattern on the substrate with a conductive paste and baking the wiring pattern of the conductive paste to form the first wiring;

coating part of the first wiring at the crossing point with an insulating paste and baking the insulating paste to form a first insulating layer, a coating thickness of the insulating paste being controlled so that a height of the first insulating layer formed adjacent to sidewalls of the first wiring at the crossing point is substantially equal to a height of the first wiring;

forming a second insulating layer on the first insulating layer and the first wiring at the crossing point; and forming the second wiring which crosses over the second insulating layer to intersect with the first wiring.

2. A method according to claim 1, wherein said conductive paste contains photosensitive material and metal particles, and the conductive paste applied to the substrate by a printing process is exposed with said wiring pattern and then developed to form the first wiring.

3. A method according to claim 1, wherein said part of the first wiring at the crossing point is coated with the insulating paste by a printing process.

4. A method according to claim 1, wherein said insulating paste contains photosensitive material, and the insulating paste applied by a printing process is exposured with the crossing point pattern and then developed to form the first insulating layer.

5. A method according to claim 1, wherein the coating and the baking of the insulating paste are conducted at least two times so that the first insulating layer formed adjacent to sidewalls of the first wiring at the crossing point comprises laminated insulating layers each of which is thinner than the first wiring.

6. A method according to claim 1, wherein a second insulating paste is applied onto the first insulating layer and the first wiring at the crossing point by a printing process and the second insulating paste is baked to form the second insulating layer which covers the crossing point.

7. A method according to claim 1, wherein a second insulating paste which contains photosensitive material is applied to the substrate by a printing process, and the second insulating paste is exposed with the crossing point pattern and developed to form the second insulating layer which covers the crossing point.

8. A method according to claim 1, wherein said second wiring is formed by patterning a conductive paste which contains photosensitive material.

9. A substrate on which a first and second wirings intersect with each other at a crossing point, manufactured by the method of claim 1.

10. A method of manufacturing an electron source substrate on which a first wiring and a second wiring connected to an electron emission device intersect with each other at a crossing point, comprising the steps of:

providing a wiring pattern on the substrate with a conductive paste and baking the wiring pattern of the conductive paste to form the first wiring;

coating part of the first wiring at the crossing point with an insulating paste and baking the insulating paste to form a first insulating layer, a coating thickness of the insulating paste being controlled so that a height of the first insulating layer formed adjacent to sidewalls of the first wiring at the crossing point is substantially equal to a height of the first wiring;

forming a second insulating layer on the first insulating layer and the first wiring at the crossing point;

forming a second wiring which crosses over the second insulating layer to intersect with the first wiring; and forming the electron emission device so as to be connected to said first and second wirings.

11. An electron source substrate manufactured by the method of claim 10.

12. A method of manufacturing image forming apparatus, comprising the steps of:

manufacturing an electron source substrate by the method of claim 10; and arranging an image forming member to be opposite to said electron source substrate, the image forming member functioning to form an image with electrons emitted from the electron emission device in said electron source substrate.

13. Image forming apparatus manufactured by the method of claim 12.

14. A method of manufacturing an electron source substrate on which a first wiring and a second wiring connected to an electron emission device intersect with each other at a crossing point, comprising the steps of:

providing a wiring pattern on the substrate and baking the wiring pattern to form the first wiring, a sidewall of which is undercut;

coating part of the first wiring at the crossing point with an insulating paste and baking the insulating paste to form a first insulating layer, a coating thickness of the insulating paste being controlled so that a height of the first insulating layer formed adjacent to sidewalls of the first wiring at the crossing point is substantially equal to a height of the first wiring;

forming a second insulating layer on the first insulating layer and the first wiring at the crossing point;

forming a second wiring which crosses over the second insulating layer to intersect with the first wiring; and forming the electron emission device so as to be connected to said first and second wirings.

15. A method according to claim 14, wherein the wiring pattern is provided with a conductive paste and the wiring pattern of the conductive paste is baked to form the first wiring.

16. A method of manufacturing an image forming apparatus, comprising the steps of:

manufacturing the electron source substrate by the method of claim 14; and arranging an image forming member to be opposite to the electron source substrate, the image forming member functioning to form an image with electrons emitted from the electron emission device in said electron source substrate.

17. Image forming apparatus manufactured by the method of claim 16.

18. A method of manufacturing a substrate on which a first wiring and a second wiring intersect with each other at a crossing point, comprising the steps of:

providing a wiring pattern on the substrate with a first paste to form the first wiring;

coating part of the first wiring at the crossing point with a second paste to form a first insulating layer, a coating thickness of the second paste being controlled so that a height of the first insulating layer formed adjacent to sidewalls of the first wiring at the crossing point is substantially equal to a height of the first wiring;

forming a second insulating layer on the first insulating layer and the first wiring at the crossing point; and forming a second wiring which crosses over the second insulating layer to intersect with the first wiring.

19. A method of manufacturing a substrate on which a first wiring and a second wiring intersect with each other at a crossing point, comprising the steps of:

providing a wiring pattern on the substrate with a first paste to form the first wiring;

coating part of the first wiring at the crossing point with a second paste to form a first insulating layer, a coating thickness of the second paste being controlled so that a height of the first insulating layer formed adjacent to sidewalls of the first wiring at the crossing point is not higher than a height of the first wiring;

forming a second insulating layer on the first insulating layer and the first wiring at the crossing point; and forming a second wiring which crosses over the second insulating layer to intersect with the first wiring.

20. A method of manufacturing an electron source substrate on which a first wiring and a second wiring connected to an electron emission device intersect with each other at a crossing point, comprising the steps of:

providing a first paste on the substrate to form the first wiring, a sidewall of which is undercut;

coating part of the first wiring at the crossing point with a second paste to form a first insulating layer, a coating thickness of the second paste being controlled so that a height of the first insulating layer formed adjacent to sidewalls of the first wiring at the crossing point is substantially equal to a height of the first wiring;

forming a second insulating layer on the first insulating layer and the first wiring at the crossing point;

forming a second wiring which crosses over the second insulating layer to intersect with the first wiring; and forming the electron emission device so as to be connected to said first and second wirings.

21. A method of manufacturing an electron source substrate on which a first wiring and a second wiring connected to an electron emission device intersect with each other at a crossing point, comprising the steps of:

providing a wiring pattern on the substrate to form the first wiring, a sidewall of which is undercut;

coating part of the first wiring at the crossing point with a paste to form a first insulating layer, a coating thickness of the paste being controlled so that a height of the first insulating layer formed adjacent to sidewalls of the first wiring at the crossing point is substantially equal to a height of the first wiring;

forming a second insulating layer on the first insulating layer and the first wiring at the crossing point;

forming a second wiring which crosses over the second insulating layer to intersect with the first wiring; and forming the electron emission device so as to be connected to said first and second wirings.

22. A method of manufacturing an electron source substrate on which a first wiring and a second wiring connected to an electron emission device intersect with each other at a crossing point, comprising the steps of:

providing a wiring pattern on the substrate to form the first wiring, a sidewall of which is undercut;

coating part of the first wiring at the crossing point with a paste to form a first insulating layer, a coating thickness of the paste being controlled so that a height of the first insulating layer formed adjacent to sidewalls of the first wiring at the crossing point is not higher than a height of the first wiring;

forming a second insulating layer on the first insulating layer and the first wiring at the crossing point;

forming a second wiring which crosses over the second insulating layer to intersect with the first wiring; and forming the electron emission device so as to be connected to said first and second wirings.

* * * * *